Nov. 24, 1970 W. W. JOHNSTON 3,543,214

PRINTED CIRCUIT BOARD CONTACT ASSEMBLY

Filed July 22, 1968 2 Sheets-Sheet 1

INVENTOR

WILBUR W. JOHNSTON

BY S. A. Giarratana

ATTORNEY

PRINTED CIRCUIT BOARD CONTACT ASSEMBLY

INVENTOR
WILBUR W. JOHNSTON

BY S. A. Giarratana
ATTORNEY

United States Patent Office 3,543,214

Patented Nov. 24, 1970

3,543,214

PRINTED CIRCUIT BOARD CONTACT ASSEMBLY

Wilbur W. Johnston, San Diego, Calif., assignor to General Precision Systems Inc., Little Falls, N.J., a corporation of Delaware Filed July 22, 1968, Ser. No. 746,562
Int. Cl. H05k *1/12*; H01r *13/54*
U.S. Cl. 339—17 3 Claims

ABSTRACT OF THE DISCLOSURE

A printed circuit board contact assembly comprising a flexible sheet having a plurality of contact members extending therethrough, the contact members being patterned similarly to the contacts on the upper surface of the printed board and adapted to register in contact therewith. Means are provided to connect the contact members to a circuit analyzer, or the like.

BACKGROUND OF THE INVENTION

This invention relates to a printed circuit board contact assembly and, more particularly, to such an assembly adapted to provide an electrical connection between a printed circuit board and a circuit analyzer.

There are several known arrangements for providing an electrical connection between a circuit analyzer and the several thousand contacts of a multi-layer printed circuit board. For example, it has been proposed to utilize movable probes that are hydraulically actuated and computer controlled. However, this arrangement involves high cost and, since the movable probe moves from circuit to circuit mechanically instead of electrically, it is relatively slow in operation.

It has also been proposed to provide one spring loaded contact pin per contact, which pins are mounted in a matrix that has been machined to mate with the printed circuit board. Each spring assembly is compressed about one quarter inch and provides a force of approximately two ounces on each contact, and the entire assembly is forced against the test board by mechanical or hydraulic pneumatic pressure. However, since machining is required to provide a matrix for each board layout and a spring loaded contact is required for each contact of the circuit board, the cost is excessively high. Also, the pins are subjected to easy damage since they are cantilevered one quarter inch to one half inch prior to compression and therefore are subject to bending and misalignment. Further, since several hundred pounds are required to compress the fixture, the resistance of one bent pin would not be noticeable but yet would severely damage the test board.

SUMMARY OF THE INVENTION

It is therefore an object of the present invention to provide a printed circuit board contact assembly which is relatively inexpensive to manufacture and which permits a relatively high number of printed circuit board contacts to be analyzed with a minimal damage to the contacts.

Briefly summarized, the contact assembly of the present invention consists of a thin sheet of flexible material through which a plurality of contact members extend in contact with the contacts of a printed circuit board, with means being provided to connect the contact members to a circuit analyzer, or the like.

BRIEF DESCRIPTION OF THE DRAWINGS

Reference is now made to the accompanying drawings for a better understanding of the nature and objects of the contact assembly of the present invention, which drawings illustrate the best mode presently contemplated for carrying out the objects of the invention and its principles, and are not to be construed as restrictions or limitations on its scope. In the drawings.

DESCRIPTION OF THE PREFERRED EMBODIMENTS

Figure 1:
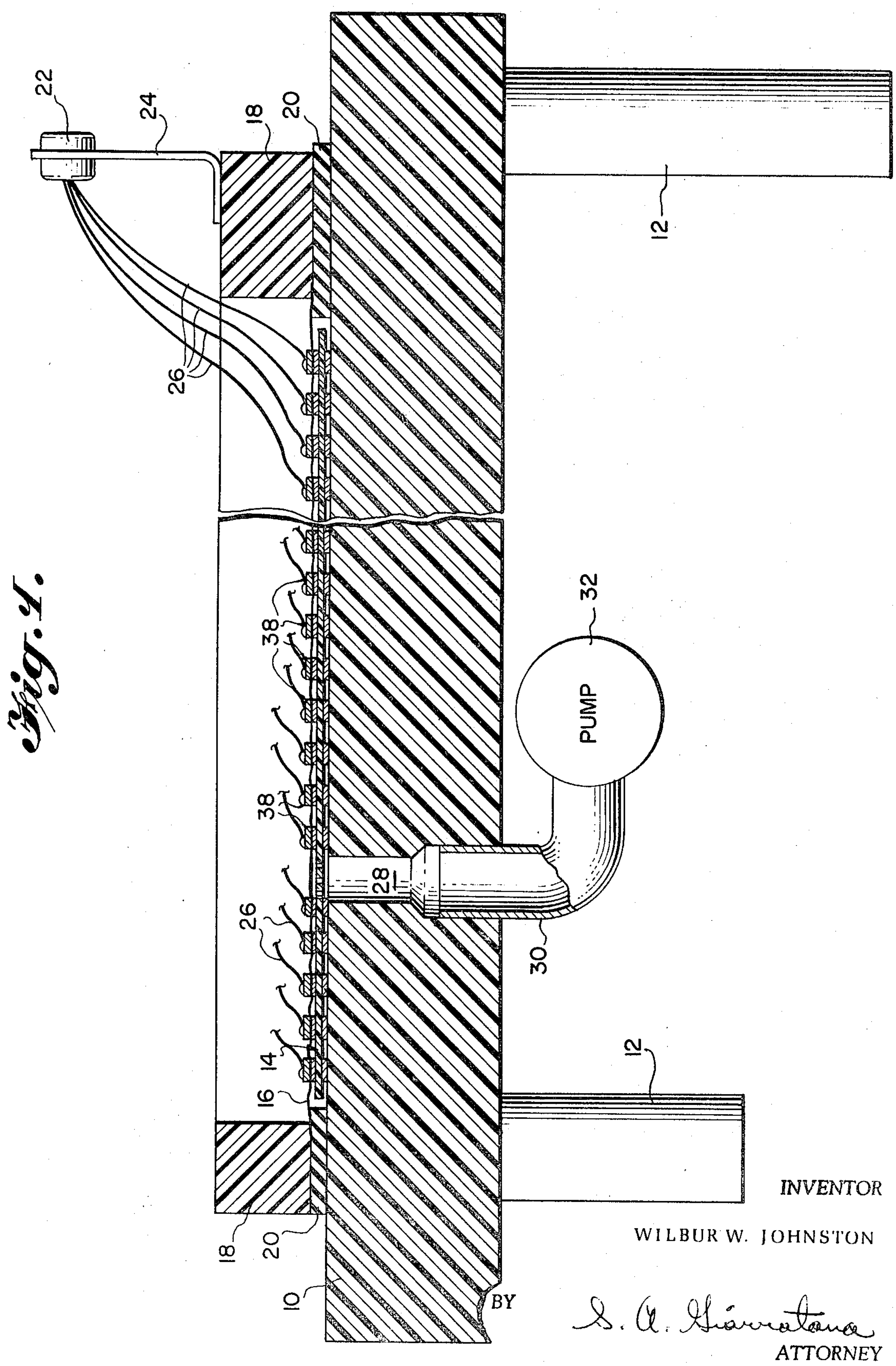
FIG. 1 is a front elevational view, partially in section, showing the contact assembly of the present invention.
Figure 2:
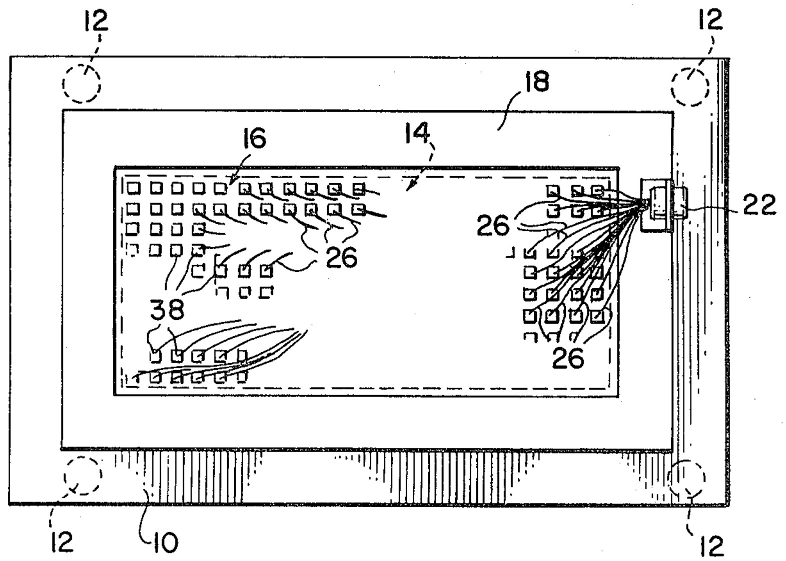
FIG. 2 is a top plan view of the assembly of the present invention on a reduced scale.

Referring specifically to FIGS. 1 and 2, the reference numeral 10 refers to a base for supporting the printed circuit board and the assembly of the present invention. The base 10 may be of any non-conductive, rigid material, such as plexiglass, for example, and is supported by a plurality of legs 12. A printed circuit board is shown generally by the reference numeral 14 and is supported by the base 10. A thin epoxy-glass sheet 16 extends over the circuit board, is mounted at its edges between a rectangular frame member 18 and a gasket 20, and has a plurality of printed circuit contact members 38 extending therethrough. A connector 22 is mounted by a support 24 on the frame 18 and is adapted to be electrically connected to the contact members 38 by means of a plurality of wires shown generally at 26. Preferably, frame 18 is of the same material as base 10, that is, plexiglass. However, it is to be appreciated that different and other well known materials may be used as well for either base 10 or frame 18 so long as they are suitably non-conductive and of rigid construction.

Figure 3:
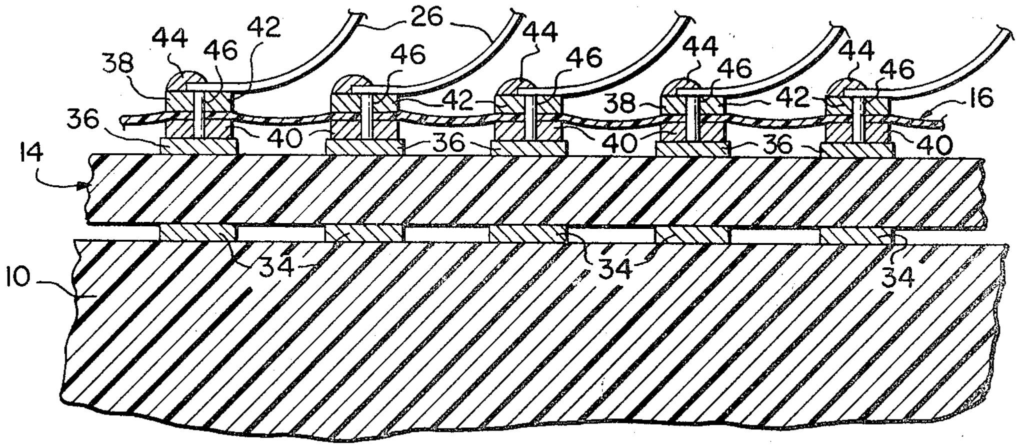
FIG. 3 is a fragmentary enlarged view of the assembly of FIG. 1.

Reference is now made to FIG. 3 which shows the details of the printed circuit board and the contact assembly of the present invention. Specifically, the circuit board 14 has a plurality of lower contact members 34 and upper contact members 36 extending therefrom, it being understood that at least a portion of these members may be formed by known electrical components and the circuit paths therebetween, or the like.

The contact members 38 can be plated through the flexible epoxy-glass sheet 16 in a known manner in a pattern exactly the same as that of the upper contact members 36 of the circuit board 14. In fact, the dot pattern of the contact members 38 can be taken from the master layout used on the circuit board which, of course, eliminates any new art work and insures good registration. Each of the contacts 38 has a lower portion 40 in contact with the upper contact 36 of the circuit board, as shown, and an upper portion 42 which is connected to the wires 26 by means of a solder connection shown at 44.

In the event the contact members 38 are made of a conductive material such as metal, an electrical connection is easily established between each wire 26 and a corresponding upper contact 36 of the circuit board. However, if it is desired to manufacture at least a large portion of each of the contact members 38 of a non-conductive material, they may be designed to accommodate a conductive material. For example, a shaft 46 of a conductive material may extend through the center portion of each of the contact members 38, as shown, to provide the electrical connection.

Means may be provided to insure a firm contact between the contact members 38 and the upper contacts 36 of the printed circuit board. For example, a vacuum pump 32 may be used to apply a differential pressure between the sheet 16 and the circuit board 14 through a flexible tube 30, a passage 28 extending through the bore 10, and a plurality of passages extending through the circuit board 14, as shown in FIG. 1.

It is understood that the connector 22 may be adapted to be connected to any external component, such as a device for analyzing the circuit of the board 14, or may itself be in the form of any such component.

It is thus seen that the assembly of the present invention permits an electrical connection to be established between a printed circuit board and a circuit analyzer, or the like, in a very simple and expeditious manner, and provides several advantages over the prior art arrangements discussed above. For example, the manufacturing costs of the assembly of the present invention is reduced and its versatility is increased, since no machining is involved and there is no need for a large number of individual assemblies, such as poga pins or the like. Furthermore, better registration is achieved between the contact members of the sheet 16 and the circuit board 14, and the assembly of the present invention requires less maintenance and provides a much simplier design.

Of course, variations of the specific construction and arrangement of the printed circuit board contact assembly disclosed above can be made by those skilled in the art without departing from the invention as defined in the appended claims.

I claim:

1. A printed circuit board contact assembly comprising in combination:

a support member having at least one plane surface supporting a printed circuit board along one of its faces, a flexible non-conductive sheet member having a plurality of spaced electrically conductive contact members extending therethrough, said support member including means for supporting said sheet member in co-extensive relation to the other of said printed circuit board's faces whereby said conductive contact members may electrically engage predetermined portions of the circuit on said printed circuit board, said support member further including a cavity communicating with said one plane surface and a vacuum means for exhausting the air in said cavity, and at least one aperture disposed within said circuit board and extending therethrough in registry with said cavity to form a suction applying means with respect to said flexible sheet member whereby firm electrical engagement between said contact members and said predetermined circuit portions on said printed circuit board may selectively be maintained.

2. The assembly defined in claim 1 wherein said plurality of electrically conductive contact members in said flexible sheet member are formed in a pattern corresponding to the pattern of circuit paths on said printed circuit board, each of said contact members being connected to an external component remotely positioned with respect to said flexure sheet member and adapted to analyse the electrical performance of said printed circuit board.

3. The assembly defined in claim 1 in which said means for supporting said flexible sheet member comprises a frame member surrounding said printed circuit board and adapted to be fixedly secured to said support member, and a gasket means interposed between said support member and said frame member, said flexible sheet member having its peripheral edge portions clamped between said frame member and said gasket means in substantially air-tight sealing engagement therewith.

References Cited

UNITED STATES PATENTS

| | | | |
|---|---|---|---|
| 2,945,162 | 7/1960 | Flour | 339—17 XR |
| 3,191,100 | 6/1965 | Sorvillo | 339—17 XR |
| 3,405,361 | 10/1968 | Kattner et al. | 324—158 |

OTHER REFERENCES

IBM Technical Disclosure Bulletin, vol. 7, No. 12, May 1965, 339–117(p), p. 1123.

MARVIN A. CHAMPION, Primary Examiner

P. A. CLIFFORD, Assistant Examiner

U.S. Cl. X.R.

339—59, 117